United States Patent
Hehn

(10) Patent No.: US 7,688,138 B2
(45) Date of Patent: Mar. 30, 2010

(54) ELECTRONIC DEVICE HAVING A PREDISTORTION FILTER AND RELATED METHODS

(75) Inventor: Bryan C. Hehn, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 36 days.

(21) Appl. No.: 12/053,717

(22) Filed: Mar. 24, 2008

(65) Prior Publication Data
US 2009/0237158 A1    Sep. 24, 2009

(51) Int. Cl.
    *H03F 1/26*    (2006.01)
(52) U.S. Cl. .................. 330/149; 330/305; 330/306; 375/297
(58) Field of Classification Search .......... 330/149, 330/305, 306; 375/297
See application file for complete search history.

(56) References Cited

U.S. PATENT DOCUMENTS

| | | | |
|---|---|---|---|
| 6,794,939 B2 * | 9/2004 | Kim et al. | 330/149 |
| 7,113,037 B2 | 9/2006 | Nezami | 330/149 |
| 7,151,405 B2 | 12/2006 | Nezami | 330/149 |
| 7,194,043 B2 * | 3/2007 | Ma | 375/296 |
| 7,269,231 B2 * | 9/2007 | Ding et al. | 375/296 |
| 7,418,056 B2 * | 8/2008 | Suzuki et al. | 375/296 |
| 7,511,574 B2 * | 3/2009 | Hongo | 330/149 |
| 2004/0179629 A1 | 9/2004 | Song et al. | 375/296 |
| 2006/0078065 A1 | 4/2006 | Cai et al. | 375/297 |
| 2006/0133536 A1 | 6/2006 | Rexberg | 375/297 |
| 2007/0063770 A1 | 3/2007 | Rexberg | 330/149 |
| 2007/0133713 A1 | 6/2007 | Dalipi | 375/297 |

OTHER PUBLICATIONS

J. Kim and K. Konstantinou "Digital Predistortion of Wideband Signals Based on Power Amplifier Model with Memory" Electronics Letters 8th of Nov. 2001, vol. 37, No. 23, pp. 1417-1418.

The Embedded Systems Experts. Wagner, Brian and Michael Barr. "Introduction to Digital Filters," Embedded Systems Programming, Dec. 2002, pp. 47-48.

L. Ding, G. Tong Zhou, D. R. Morgan, J. Stevenson Kennedy, J. Kim, and C.R. Giardina "A Robust Digitial Baseband Predistorter Constructed Using Memory Polynomials" Jan. 2004, vol. 32, pp. 159-165.

S. Hone, Y. Yun Woo, J. kim, J. Cha, I. Kim, J. Moon, Y. Yi, and B. Kim "Weighted Polynomial Digital Predistortion for Low Memory Effect Doherty Power Amplifier" May 5, 2007, vol. 55, No. 5, pp. 925-931.

* cited by examiner

*Primary Examiner*—Patricia Nguyen
(74) *Attorney, Agent, or Firm*—Allen, Dyer, Doppelt, Milbrath & Gilchrist, P.A.

(57) ABSTRACT

An electronic device includes a nonlinear power amplifier, a predistortion coefficient calculator, and a memory polynomial predistortion filter coupled to the nonlinear power amplifier and to the predistortion coefficient calculator. The memory polynomial predistortion filter may include a plurality of finite impulse response (FIR) filter stages, and a summer coupled to the plurality of FIR filter stages. The FIR filter stages may functionally operate in parallel or may include a series of FIR filters coupled in parallel.

17 Claims, 4 Drawing Sheets

ELECTRONIC DEVICE HAVING A PREDISTORTION FILTER AND RELATED METHODS

GOVERNMENT LICENSE RIGHTS

This invention was made with Government support under contract No. N00039-04-C-0035, awarded by The Space and Naval Warfare Systems Command, San Diego, Calif. The Government has certain rights in this invention.

FIELD OF THE INVENTION

The present invention relates to the field of electronic devices, and, more particularly, to electronic devices including a memory polynomial predistortion filter and related methods.

BACKGROUND OF THE INVENTION

The typical communications transmitter comprises a signal generator, for example, a processor, for providing a low power input signal to be transmitted. The transmitter may also include a power amplifier coupled to the signal generator, and an antenna coupled to an output of the power amplifier. The power amplifier amplifies the power of the input signal from the signal generator for transmission via the antenna.

In an ideal implementation, the power amplifier is a linear device, i.e. the power amplifier produces an amplified replica of the low power electrical signal. In other words, the amplified signal may have identical phase and frequency characteristics to the input signal. Nonetheless, the typical power amplifier may be nonlinear. The power amplifier produces an amplified signal that may have distinctive phase and frequency characteristics to the input signal, i.e. the amplified signal is distorted.

The typical power amplifier may be near linear within an optimum operating range, for example, a certain range of amplitude in the input signal. Outside this optimum operating range, the power amplifier may become nonlinear. Indeed, as the input signal deviates further from the optimum operating range of the power amplifier, the nonlinearity of the power amplifier may increase. The typical optimum operating range of the power amplifier may be increased with a corresponding increase in the size and complexity of the power amplifier. This increase in size and power consumption may be undesirable for low power communications, for example, satellite relay communications.

An approach to address the shortcomings of a nonlinear power amplifier may be to include a predistortion filter coupled between the signal generator and the power amplifier. The predistortion filter predistorts the input signal to have inverse changes, such as, in the frequency and phase characteristics, to those imparted by the distortion of the power amplifier so that the amplified signal may have a greater degree of linearity.

Another approach to the predistortion filter is disclosed in the article Kim et al., "Digital Predistortion of Wideband Signals Based On Power Amplifier Model With Memory," Electronics Letters, pages 1417-1418, 8 Nov. 2001, Vol. 37, Issue 23, the entire contents of which are incorporated here by reference. This method includes using a memory polynomial to predistort the input signal.

Another approach to the predistortion filter is disclosed in the article Ding et al., "A Memory Polynomial Predistorter Implemented USING TMS320C67XX," the entire contents of which are incorporated here by reference. The device of Ding et al. includes a memory polynomial predistortion filter, and a predistortion construction module for generating the memory polynomial for predistorting the input signal. The memory polynomial of Ding et al. has the formula below, where x(n) is the input signal, z(n) is the predistorted input signal, K is the order of nonlinearity, Q is the amount of memory, and $a_{kq}$ are complex valued coefficients.

$$z(n) = \sum_{k=1}^{K} \sum_{q=0}^{Q} a_{kq} x(n-q) |x(n-q)|^{k-1}$$

Another approach to the predistortion filter is disclosed in U.S. Patent Application Publication No. 2007/0063770 to Rexberg. The predistortion filter of Rexberg includes a Finite Impulse Response (FIR) structure and corresponding lookup tables. Rexberg also uses the memory polynomial of Ding et al. but expands the Q term in the memory polynomial for computation to provide the following result.

$$\text{Separate delays into different sums} \begin{cases} = \sum_{k=1}^{K} a_{k0} x(n) |x(n)|^{k-1} + \\ + \sum_{k=1}^{K} a_{k1} x(n-1) |x(n-1)|^{k-1} + \\ \quad \vdots \\ + \sum_{k=1}^{K} a_{kQ} x(n-Q) |x(n-Q)|^{k-1} \end{cases}$$

Nonetheless, the approach of Rexberg may suffer from several drawbacks. Specifically, the expansion of the memory polynomial in Rexberg may not be easily reduced to a FIR filter structure without making several assumptions that may reduce the effectiveness of the predistortion filter. Moreover, the remaining summation terms may not be reduced to respective FIR filters.

In these approaches to the predistortion filter that uses memory polynomials, the device may include a processor for producing the memory polynomial coefficients. This computation of coefficients may be intensive and can become cumbersome when applied to a high bandwidth input signal.

SUMMARY OF THE INVENTION

In view of the foregoing background, it is therefore an object of the present invention to provide an electronic device having a memory polynomial predistortion filter that is efficient and robust.

This and other objects, features, and advantages in accordance with the present invention are provided by an electronic device that includes a nonlinear power amplifier, a predistortion coefficient calculator, and a memory polynomial predistortion filter coupled to the nonlinear power amplifier and to the predistortion coefficient calculator. The memory polynomial predistortion filter may include a plurality of finite impulse response (FIR) filter stages, and a summer coupled to the plurality of FIR filter stages. Advantageously, the FIR filters are robust and low resource building blocks for digital signal processing devices.

Moreover, the plurality of FIR filter stages may functionally operate in parallel. For example, the plurality of FIR filter stages may comprise a plurality of individual FIR filters coupled in parallel to thereby functionally operate in parallel.

The plurality of FIR filter stages may also comprise a single FIR filter operating successively to thereby functionally operate in parallel.

Furthermore, the memory polynomial predistortion filter may further comprise a plurality of multipliers coupled upstream of the plurality of FIR filter stages. The summer may be coupled downstream from the plurality of FIR filter stages. The plurality of FIR filter stages may comprise k stages. The plurality of multipliers may be configured so that each kth FIR filter stage is input with a product of an input sample and an absolute value of the input sample to the k−1 power.

Additionally, the memory polynomial predistortion filter may be implemented in a digital signal processor, an application-specific integrated circuit (ASIC), or a field-programmable gate array (FPGA), for example.

Another aspect is directed to a method for compensating nonlinearity in a power amplifier coupled to a memory polynomial predistortion filter and to a predistortion coefficient calculator. The method may include implementing the memory polynomial predistortion filter as a plurality of FIR filter stages, and a summer coupled to the plurality of FIR filter stages.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and multiple prime notation is used to indicate similar elements in alternative embodiments.

Figure 1:
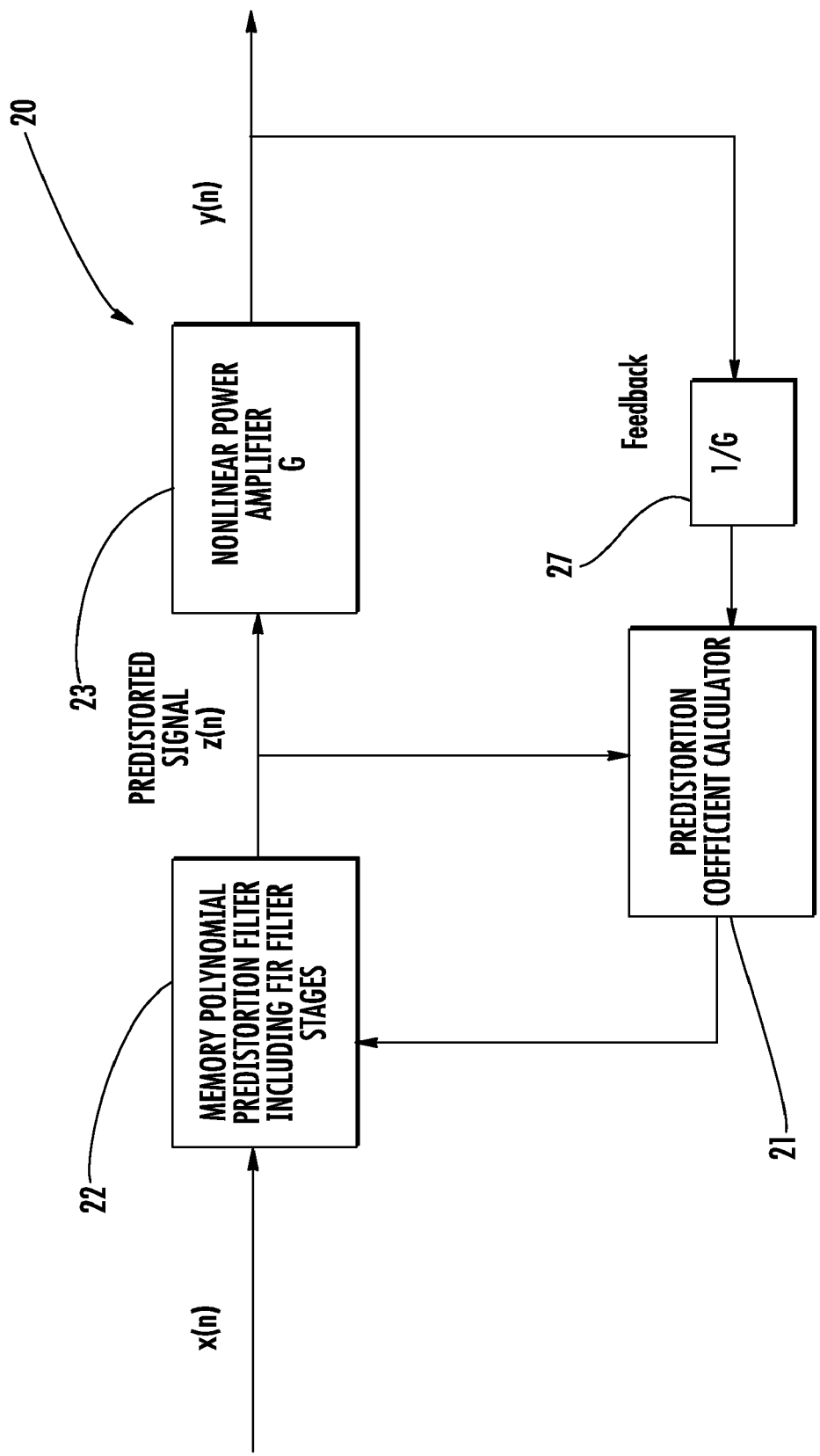
FIG. 1 is a schematic diagram of an electronic device having a memory polynomial predistortion filter, according to the present invention.

Referring initially to FIG. 1, an electronic device 20 according to the present invention is now described. The electronic device 20 illustratively includes a nonlinear power amplifier 23, a predistortion coefficient calculator 21, and a memory polynomial predistortion filter 22 coupled to the nonlinear power amplifier and to the predistortion coefficient calculator. The predistortion coefficient calculator 21 and the memory polynomial predistortion filter 22 cooperate to pre-distort an input signal x(n) and provide the predistorted input signal z(n), which is fed into the nonlinear power amplifier 23, for compensating for the nonlinearity of the nonlinear power amplifier. The predistortion coefficient calculator 21 receives feedback from the predistorted signal z(n) and the amplified signal y(n), via an attenuator 27 having an inverse gain to the nonlinear power amplifier 23.

Advantageously, by compensating for the nonlinearity of the nonlinear power amplifier 23, the power consumption of the electronic device 20 may be reduced. Additionally, the back-off requirement of the nonlinear power amplifier 23 may be reduced, and the number of data channels per allocated frequency may be increased, for example.

The memory polynomial predistortion filter 22 may be based upon the following memory polynomial, where K is the order of nonlinearity, Q is the amount of memory, and $a_{kq}$ are complex valued coefficients provided by the predistortion coefficient calculator 21.

$$z(n) = \sum_{k=1}^{K} \sum_{q=0}^{Q} a_{kq} x(n-q) |x(n-q)|^{k-1} \quad (1)$$

Additionally, the memory polynomial predistortion filter 22 may be implemented in one of a digital signal processor (DSP), an application-specific integrated circuit (ASIC), and a field-programmable gate array (FPGA), for example, a Xilinx Virtex4 SX55 FPGA of the Xilinx, Inc. of San Jose, Calif.

Figure 2:
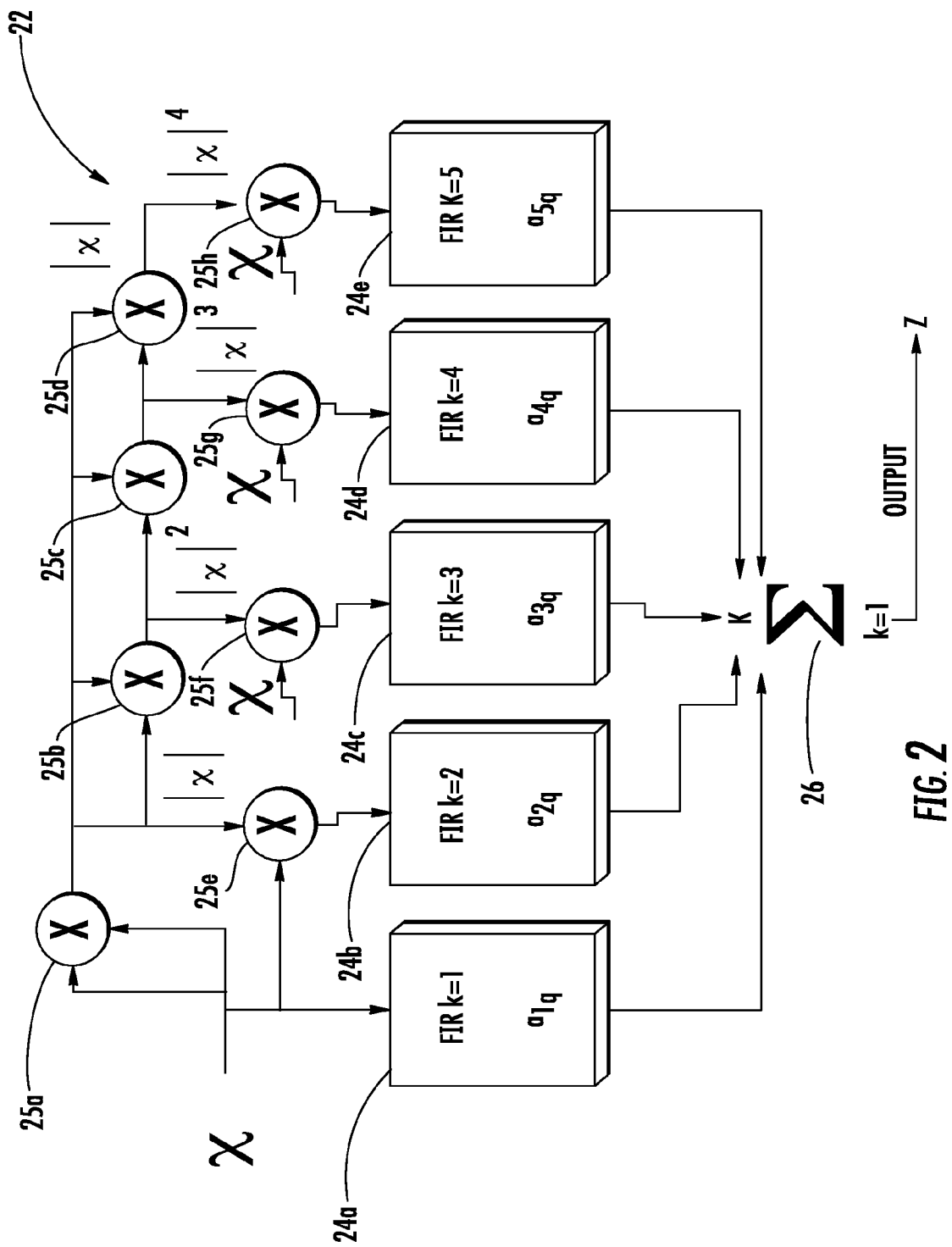
FIG. 2 is a schematic diagram of the memory polynomial predistortion filter as in FIG. 1.

Referring additionally to FIG. 2, the memory polynomial predistortion filter 22 illustratively includes a plurality of finite impulse response (FIR) filter stages 24a-24e, for example, illustrated as five, and a summer 26 coupled downstream to the plurality of FIR filter stages. Advantageously, this implements the memory polynomial of equation 1 with parallel FIR filters 24a-24e. Moreover, the FIR filters may be efficient building blocks for the memory polynomial predistortion filter 22.

With K=5, equation 1 is expanded into the following result, which is provided by the memory polynomial predistortion filter 22.

$$z(n) = \sum_{q=0}^{Q} a_{1q} x(n-q) + \quad (2)$$

$$\sum_{q=0}^{Q} a_{2q} x(n-q) |x(n-q)| + \sum_{q=0}^{Q} a_{2q} x(n-q) |x(n-q)|^2 +$$

$$\sum_{q=0}^{Q} a_{2q} x(n-q) |x(n-q)|^3 + \sum_{q=0}^{Q} a_{2q} x(n-q) |x(n-q)|^4$$

As will be appreciated by those skilled in the art, equation 2 may be expanded out to K terms, and the memory polynomial predistortion filter 22 may include K FIR filter stages 24a-24e rather than the illustrated five. The value of K and the corresponding number of FIR filter stages 24a-24e are directly proportional to the order of nonlinearity in the nonlinear power amplifier 23 that is being compensated for by the memory polynomial predistortion filter 22. As will be appreciated by those skilled in the art, each FIR filter stage 24a-24e has a length of Q and respective series of coefficients, see e.g. Wagner et al., "Introduction to Digital Filters," Embedded Systems Programming, December 2002, pp. 47-48, the entire contents of which are incorporated here by reference. In other words, each FIR filter stage 24a-24e comprises a FIR filter of Q length and a series of coefficients, each series of coefficients being based upon the memory polynomial coefficients $a_{kq}$.

Advantageously, the FIR filter stages 24a-24e may be tuned via the length and series of coefficients based upon the respective nonlinear device. The FIR filter stage 24a-24e may be implemented, for example, as a direct form FIR filter, a bit-serial (distributed arithmetic) FIR filter, a lattice FIR filter, a lookup table FIR filter, a single multiplier/accumulator (MAC) FIR filter, a non-multiplier FIR filter, or a DSP (software) based FIR filter.

More specifically, the FIR filter is defined by the following equation, where the output of the FIR filter is v(n), the series of coefficients is $a_q$, and f(n) is the input of the filter.

$$v(n) = \sum_{q=0}^{Q} a_q f(n-q) \qquad (3)$$

Hence, if the following relation is held true, $$f_k(n-q) = x(n-q)|x(n-q)|^{k-1}, \qquad (4)$$

and use $f_k$ in the equation 3 with K sets of coefficients, $a_k$ to provide:

$$v_k(n) = \sum_{q=0}^{Q} a_{kq} f_k(n-q) \qquad (5)$$

then equation 2 may be reformed as a sum of FIR filters.

$$z(n) = v_1(n) + v_2(n) + v_3(n) + v_4(n) + \ldots v_k(n) \qquad (6)$$

Moreover, in some embodiments (not shown), the even FIR filter stages 24b, 24d may be omitted to reduce consumption of resources in the memory polynomial predistortion filter 22. In other words, k may be defined by the following series: 1, 3, 5, 7, . . . K. Nonetheless, the use of both even and odd k FIR filter stages 24a-24e provides for more effective predistortion of the nonlinearity of the nonlinear power amplifier 23.

Furthermore, the memory polynomial predistortion filter 22 illustratively includes a plurality of multipliers 25a-25h, for example, illustrated as eight multipliers, coupled upstream of the plurality of FIR filter stages 24a-24e. The summer 26 is illustratively coupled downstream from the plurality of FIR filter stages 24a-24e. The plurality of multipliers 25a-25h are illustratively configured so that each kth FIR filter stage 24a-24e is input with a product of an input sample, with memory, and an absolute value of the input sample, with memory, to the k−1 power, as shown in equation 7.

$$x(n-q)|x(n-q)|^{k-1} \qquad (7)$$

As will be appreciated by those skilled in the art, for hardware implementations, for example, FPGAs or ASICs, the memory polynomial predistortion filter 22 has a clock speed being directly related to a computational speed. The memory polynomial predistortion filter 22 illustratively uses parallel processing. For example, in some embodiments, the plurality of FIR filter stages 24a-24e may comprise a plurality of individual FIR filters coupled in parallel to thereby functionally operate in parallel. In these embodiments, the input signal x(n) may have a large bandwidth, for example, having a sampling frequency of about 100 mega-samples per second, which the parallel FIR filter arrangement is advantageously suited for.

Figure 3:
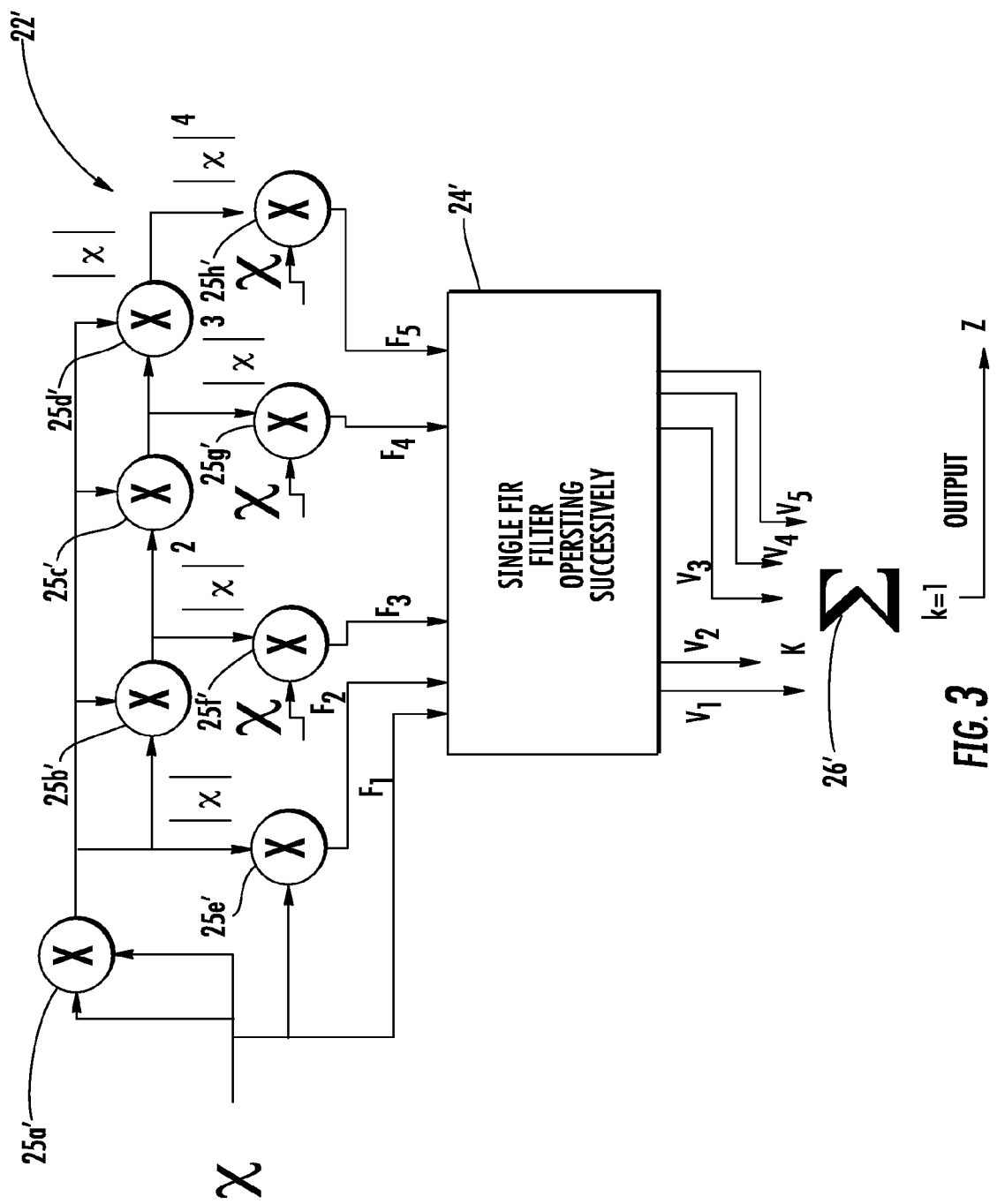
FIG. 3 is a schematic diagram of a second embodiment of the memory polynomial predistortion filter according to the present invention.

Referring now to FIG. 3, another embodiment of the memory polynomial predistortion filter 22' is now described.

In this embodiment of the memory polynomial predistortion filter 22', those elements already discussed above with respect to FIG. 2 are given prime notation and most require no further discussion herein. This embodiment differs from the previous embodiment in that the memory polynomial predistortion filter 22' uses serial processing. The plurality of FIR filter stages 24a-24e from the prior embodiment illustratively comprises a single FIR filter 24' operating successively to thereby functionally operate in parallel. The single FIR filter 24' receives the respective outputs $f_1$-$f_5$ of the plurality of multipliers 25a'-25h' upstream and produces respective outputs $v_1$-$v_5$ for accumulation by the summer 26'. In these embodiments, the clock speed of the memory polynomial predistortion filter 22' may be sufficiently greater than the sampling speed of the input signal x(n) to compute the results of K FIR filter stages (5 illustrated) with a single FIR filter 24'. In other words, the single FIR filter 24' executes K times for each sample of the input signal x(n), thereby effectively producing the results of K parallel FIR filters yet advantageously consuming only the resources for one FIR filter in the memory polynomial predistortion filter 22'.

The multiplier in each FIR filter would execute K*Q times. As will be appreciated by those skilled in the art, this embodiment is advantageous for low bandwidth/data rate and low resource applications, for example, input signal having about 1-10 mega-samples per second.

Referring again to FIG. 1, as will be appreciated by those skilled in the art, the predistortion coefficient calculator 21 may be trained based upon the predistorted signal z(n) and the output signal y(n). Since the memory polynomial is linear in the defining coefficients $a_{kq}$, the training may be accomplished in a least-squares error approach without implementing the memory polynomial. Advantageously, periodically retraining the predistortion coefficient calculator 21 may improve performance with nonlinear power amplifiers 23 that have varying characteristics.

The training operates on blocks of complex baseband input and output waveform samples, z(n) and y(n). The memory polynomial's estimate of the input sequence given the output sequence is $$\hat{z}(n) = \sum_{k=1}^{K} \sum_{q=0}^{Q} a_{kq} \frac{y(n-q)}{G} \left| \frac{y(n-q)}{G} \right|^{k-1}. \qquad (8)$$

For blocks of training data, this estimate can be recast in matrix form:

$$\hat{z} = \begin{bmatrix} \hat{z}(1) \\ \hat{z}(2) \\ \vdots \\ \hat{z}(N) \end{bmatrix} = Ua = U \begin{bmatrix} a_{10} \\ a_{11} \\ \vdots \\ a_{KQ} \end{bmatrix} \qquad (9)$$

$$U = \begin{bmatrix} u_{10}(1) & u_{11}(1) & \ldots & u_{KQ}(1) \\ u_{10}(2) & u_{11}(2) & \ldots & u_{KQ}(2) \\ \vdots & \vdots & \vdots & \vdots \\ u_{10}(N) & u_{11}(N) & \ldots & u_{KQ}(N) \end{bmatrix}$$

$$u_{kq}(n) = \frac{y(n-q)}{G} \left| \frac{y(n-q)}{G} \right|^{k-1}.$$

The least squares solution for the coefficient vector is:

$$a = (U^H U)^{-1} U^H z \quad z = \begin{bmatrix} z(1) \\ z(2) \\ \vdots \\ z(N) \end{bmatrix} \quad \text{minimizes } \|z - \hat{z}\|^2 \tag{10}$$

where $U^H$ is Hermitian, or a complex conjugate, of the transpose of U.

Another aspect is directed to a method for compensating nonlinearity in a power amplifier 23 coupled to a memory polynomial predistortion filter 22 and to a predistortion coefficient calculator 21. The method includes implementing the memory polynomial predistortion filter 22 as a plurality of FIR filter stages 24a-24e, and a summer 26 coupled to the plurality of FIR filter stages.

Figure 4:
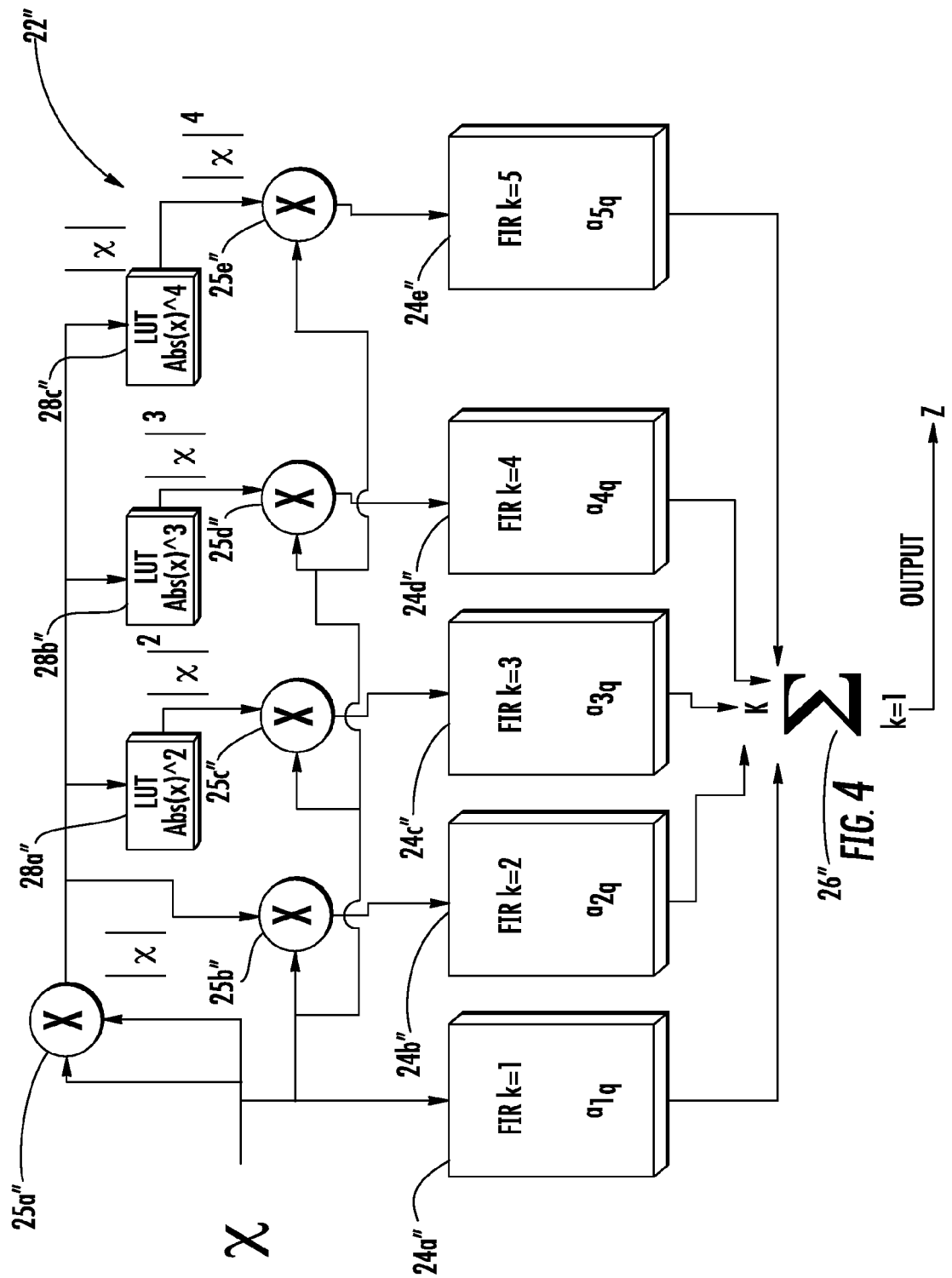
FIG. 4 is a schematic diagram of a third embodiment of the memory polynomial predistortion filter according to the present invention.

Referring now to FIG. 4, another embodiment of the memory polynomial predistortion filter 22" is now described, In this embodiment of the memory polynomial predistortion filter 22", those elements already discussed above with respect to FIG. 2 are given double prime notation and most require no further discussion herein. This embodiment differs from the previous embodiment in that the memory polynomial predistortion filter 22" uses lookup tables 28a"-28c" to provide the value $|x(n-q)|^{k-1}$.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
  a nonlinear power amplifier;
  a predistortion coefficient calculator; and
  a memory polynomial predistortion filter coupled to said nonlinear power amplifier and to said predistortion coefficient calculator for receiving an input sample and comprising
    a plurality of finite impulse response (FIR) filter stages,
    a summer coupled to said plurality of FIR filter stages, and
    a plurality of multipliers coupled upstream of said plurality of FIR filter stages, each of said plurality of multipliers being configured to receive both the input sample and an absolute value of the input sample.

2. The electronic device according to claim 1 wherein said plurality of FIR filter stages functionally operates in parallel.

3. The electronic device according to claim 2 wherein said plurality of FIR filter stages comprises a plurality of individual FIR filters coupled in parallel to thereby functionally operate in parallel.

4. The electronic device according to claim 2 wherein said plurality of FIR filter stages comprises a single FIR filter operating successively to thereby functionally operate in parallel.

5. The electronic device according to claim 1 wherein said plurality of FIR filter stages comprises k stages; and wherein said plurality of multipliers are configured so that each kth FIR filter stage is input with a product of the input sample and the absolute value of the input sample to the k−1 power.

6. The electronic device according to claim 1 wherein said memory polynomial predistortion filter is implemented in a digital signal processor.

7. The electronic device according to claim 1 wherein said memory polynomial predistortion filter is implemented in an application-specific integrated circuit (ASIC).

8. The electronic device according to claim 1 wherein said memory polynomial predistortion filter is implemented in a field-programmable gate array (FPGA).

9. An electronic device comprising:
  a nonlinear power amplifier;
  a predistortion coefficient calculator; and
  a memory polynomial predistortion filter coupled to said nonlinear power amplifier and to said predistortion coefficient calculator for receiving an input sample and comprising
    a plurality of finite impulse response (FIR) filter stages functionally operating in parallel, said plurality of FIR filter stages comprising k stages,
    a plurality of multipliers coupled upstream of said plurality of FIR filter stages, each of said plurality of multipliers being configured to receive both the input sample and an absolute value of the input sample, and
    a summer coupled downstream of said plurality of FIR filter stages
    said plurality of multipliers being configured so that each kth FIR filter stage is input with a product of the input sample and the absolute value of the input sample to the k−1 power.

10. The electronic device according to claim 9 wherein said plurality of FIR filter stages comprises a plurality of individual FIR filters coupled in parallel to thereby functionally operate in parallel.

11. The electronic device according to claim 9 wherein said plurality of FIR filter stages comprises a single FIR filter operating successively to thereby functionally operate in parallel.

12. A method for compensating nonlinearity in a power amplifier coupled to a memory polynomial predistortion filter and to a predistortion coefficient calculator for receiving an input sample, the method comprising:
  implementing the memory polynomial predistortion filter as a plurality of finite impulse response (FIR) filter stages, a summer coupled to the plurality of FIR filter stages, and a plurality of multipliers coupled upstream of the plurality of FIR filter stages and each being configured to receive both the input sample and an absolute value of the input sample.

13. The method according to claim 12 wherein implementing the memory polynomial predistortion filter comprises functionally operating the plurality of FIR filter stages in parallel.

14. The method according to claim 13 wherein the plurality of FIR filter stages comprises a plurality of individual FIR filters coupled in parallel to thereby functionally operate in parallel.

15. The method according to claim 13 wherein the plurality of FIR filter stages comprises a single FIR filter operating successively to thereby functionally operate in parallel.

16. The method according to claim 12 wherein the plurality of FIR filter stages comprises k stages; and further comprising configuring the plurality of multipliers so that each kth FIR filter stage is input with a product of the input sample and the absolute value of the input sample to the k−1 power.

17. The method according to claim 12 wherein implementing the memory polynomial predistortion filter comprises implementing the memory polynomial predistortion filter in at least one of a digital signal processor, an application-specific integrated circuit (ASIC), and a field-programmable gate array (FPGA).

* * * * *